(12) United States Patent
Dittrich

(10) Patent No.: US 7,750,720 B2
(45) Date of Patent: Jul. 6, 2010

(54) CIRCUIT ARRANGEMENT AND A METHOD FOR GALVANICALLY SEPARATE TRIGGERING OF A SEMICONDUCTOR SWITCH

(75) Inventor: Thomas Dittrich, Steinfeld (DE)

(73) Assignee: Bosch Rexroth AG, Stuttgart (DE)

( * ) Notice: Subject to any disclaimer, the term of this patent is extended or adjusted under 35 U.S.C. 154(b) by 0 days.

(21) Appl. No.: 12/091,203

(22) PCT Filed: Sep. 5, 2006

(86) PCT No.: PCT/EP2006/008633

§ 371 (c)(1), (2), (4) Date: Apr. 23, 2008

(87) PCT Pub. No.: WO2007/054149

PCT Pub. Date: May 18, 2007

(65) Prior Publication Data

US 2009/0231018 A1    Sep. 17, 2009

(30) Foreign Application Priority Data

Nov. 7, 2005    (EP) .................................. 05024239

(51) Int. Cl.
*H03K 17/00* (2006.01)

(52) U.S. Cl. ........................................ 327/365; 327/427

(58) Field of Classification Search .................. 327/365, 327/376, 377, 427, 434
See application file for complete search history.

(56) References Cited

U.S. PATENT DOCUMENTS

| 4,461,966 | A |   | 7/1984  | Hebenstreit |         |
|-----------|---|---|---------|-------------|---------|
| 4,705,962 | A |   | 11/1987 | Kinoshita et al. | |
| 5,546,043 | A | * | 8/1996  | Pollmeier   | 327/427 |
| 5,635,867 | A | * | 6/1997  | Timm        | 327/427 |
| 5,828,261 | A | * | 10/1998 | Antone et al. | 327/387 |
| 5,939,927 | A | * | 8/1999  | Myers       | 327/390 |

FOREIGN PATENT DOCUMENTS

| DE | 198 14 745 | 10/1999 |
|----|------------|---------|
| JP | 60244120   | 12/1985 |
| WO | 90/13178   | 11/1990 |

\* cited by examiner

*Primary Examiner*—Hai L Nguyen
(74) *Attorney, Agent, or Firm*—Michael J. Striker

(57) ABSTRACT

A circuit arrangement and a method for the DC-isolated driving of a semiconductor switch, wherein the circuit arrangement has a control circuit, a driver, a transformer for the DC-isolated transfer of a drive signal from the controller as switching signal into the driver and means for rectifying the switching signal, wherein the driver contains the semiconductor switch having a gate, a source and a drain, wherein the semiconductor switch can be switched by a predetermined first voltage between the gate and the source with the result that a predetermined current flows between the drain and the source, wherein the switching signal can be applied to the gate in order to switch the semiconductor switch, wherein the driver contains a control transistor having a base, an emitter and a collector, wherein the control transistor can be switched by a predetermined second voltage between the base and the emitter, with the result that the gate of the semiconductor switch can be connected to the source of the semiconductor switch via the emitter and the collector in order to change over the semiconductor switch, wherein voltage generating means are provided for generating a third voltage, rectified with respect to the second voltage, between the base and the collector of the control transistor.

11 Claims, 2 Drawing Sheets

CIRCUIT ARRANGEMENT AND A METHOD FOR GALVANICALLY SEPARATE TRIGGERING OF A SEMICONDUCTOR SWITCH

The present invention relates to a circuit arrangement and to a method for galvanically separate triggering of a semiconductor switch.

PRIOR ART

Potential-free gate triggering means in power electronics are used again and again when the triggering electronics and the switch are at least in part at different potentials. This is the case for instance with step-down converters, inverter bridges, and phase controls in the alternating current network.

In known circuitry embodiments, the gate of the semiconductor switch is triggered for instance via a driver with optoelectronic separation. Furnishing the supply voltage of the driver and hence the triggering power of the semiconductor switch is accomplished via a galvanically separate power pack with a high-frequency transformer. In this circuitry concept, two separate-potential current paths are therefore necessary, involving a corresponding amount of effort and expense for circuitry, for triggering a switch.

Versions also exist in which the switching power and switch signal are transmitted together via a transformer. The control signal for switching on the semiconductor switch is furnished as a high-frequency signal at the primary input to the transformer. For switching the switch off, the primary-side signal is shut off. This circuit arrangement does make do without an additional auxiliary supply voltage for the switch members on the power side, but the precision of the switch signals is inadequate for many applications. For switching the semiconductor switch to the nonconducting state, the voltage is withdrawn at the primary-side winding of the transformer. As a result, the gate of the semiconductor switch can be discharged via a transistor connected to it, whereupon finally it has a residual potential at the level of the base-to-emitter voltage of the transistor, which in a Darlington transistor is 1.4 V, for instance, together with voltages that drop at resistors located in the current path. In the prior art, residual gate voltages of approximately 2.5 V are achieved. Since the charge reversal of the Miller capacitance of the semiconductor switch can lead to additional voltage peaks, the problem arises that the semiconductor switch, on reaching its minimal activation voltage, will be unintentionally reset to the conducting state (double- or multiple-switching). This kind of circuit arrangement is therefore unsuitable for high-frequency operation in inverters, for instance.

For such cases, in the prior art, triggering means via an optical coupler are used, which as noted above require increased expense for components and are therefore relatively expensive to produce. In addition, in this version higher switching losses occur, since in addition to the triggering energy of the switch, the supply energy of the driver component must also be furnished.

The problem therefore arises of disclosing a circuit arrangement and a device for galvanically separate triggering of a semiconductor switch that are suitable particularly for high-frequency inverter operation, with less component complexity and expense.

According to the invention, a circuit arrangement and a method for galvanically separate triggering of a semiconductor switch as defined by the independent claims are presented. Advantageous features are the subject of the dependent claims.

ADVANTAGES OF THE INVENTION

The ensuing description applies equally to the circuit arrangement of the invention and the method of the invention, unless expressly stated otherwise.

By means of the present invention, the effort and expense for components can be reduced. As a result, the circuit arrangements can be produced more economically. Because the triggering of the switch is done via only a single current path, or in other words, the trigger signal simultaneously provides the triggering power, the complexity and expense for circuitry (costs, number of components, space required) can be minimized. A further advantage is a very low power demand, since only the triggering power of the switch has to be furnished from the control voltage supply, which in the preferred exemplary embodiment of FIG. 2 is for instance only 0.8 W per driver stage, at 16 kHz pulse width modulation. In principle, only the switch-on or switch-off signal is transmitted without potential (depending on the semiconductor switch and/or control transistor used, such as unipolar, bipolar, n-channel, p-channel, npn, pnp, and so forth, it being understood to one skilled in the art which combination of semiconductor switch and control transistor is suitable for the intended purpose). The other switching event is accomplished passively to switch potential.

In a preferred feature of the invention, the base electrode of the control transistor is connected to one pole of the voltage generating means and via at least two and preferably three diodes to the source electrode of the semiconductor switch. This connection can be made via the high-frequency transformer. As result, a predetermined voltage difference, which for three silicone diodes is for instance 2.1 V, can be achieved between the base electrode of the control transistor and the source electrode of the semiconductor switch, or ground. Hence the gate electrode of the semiconductor switch can advantageously be brought down to zero potential.

In the invention, the voltage generating means are advantageously embodied as at least one capacitor component, in particular a preferably 10 nF capacitor. Also advantageously, a resistive component, in particular a resistor, can be provided for limiting the charge current. Hence the intended third voltage is easily obtained. The capacitive component is charged in a switching event, whereupon it is capable of furnishing the third voltage for the other switching event.

Preferably, the invention has a diode array, which has at least one Zener diode with protection against polarity reversal, between the base electrode and the collector electrode of the control transistor, for limiting the voltage between the gate electrode and the source electrode of the semiconductor switch. As a result, the semiconductor switch can be protected against damage.

It is advantageous if in the invention, a capacitive component, in particular a capacitor, between the gate electrode and the source electrode of the semiconductor switch, for buffering interference currents fed in via a Miller capacitance of the semiconductor switch is provided. As a result of the Miller capacitances between the electrodes of the semiconductor switch, high current peaks that can interfere with the operation of the arrangement, for instance in an inverter during the activation phase, are fed in. These peaks are buffered by the capacitance provided and their effect is thus suppressed.

Expediently in the invention, the semiconductor switch is embodied as a unipolar transistor, in particular as a FET, MOSFET, or IGBT. These transistors allow high currents to be switched at little switching power. The semiconductor switch may, however, also be embodied as a bipolar transistor.

In a highly preferred feature of the invention, the semiconductor switch is embodied as a unipolar n-channel transistor and the control transistor is embodied as a bipolar pnp transistor and the gate electrode of the semiconductor switch is connected to the emitter electrode of the control transistor, and the source electrode of the semiconductor switch is connected to the collector electrode of the control transistor, and the voltage generating means are embodied for generating a negative voltage between the base electrode and the collector electrode of the control transistor. This version can advantageously be used for operating inverters for three-phase motors, in which a signal in the control circuit closes the semiconductor switch, or in other words causes current to flow, and after the shutoff of the control signal, the semiconductor switch is opened by means of the auxiliary voltage provided according to the invention.

Also in the invention, it is preferred that the base electrode of the control transistor is connected to the negative pole of the voltage generating means and, via at least two and preferably three diodes to the source electrode of the semiconductor switch or ground. By this embodiment, in the switch-off phase, the base of the control transistor is applied to negative potential. Hence advantageously, by means of the negative auxiliary voltage furnished, the gate can be brought down to zero potential, since there is a negative voltage, in the case of three silicone diodes 2.1 V, for instance, the base electrode of the control transistor and the source electrode of the semiconductor switch or ground.

Further advantages and features of the invention will become apparent from the description and the accompanying drawings.

It is understood that the aforementioned characteristics to be explained in further detail below can be used not only in the various combinations indicated but also in other combinations or on their own without departing from the scope of the present invention.

The invention is shown schematically in the drawings in the form of one exemplary embodiment and will be described in detail below in conjunction with the drawings.

Figure 1:
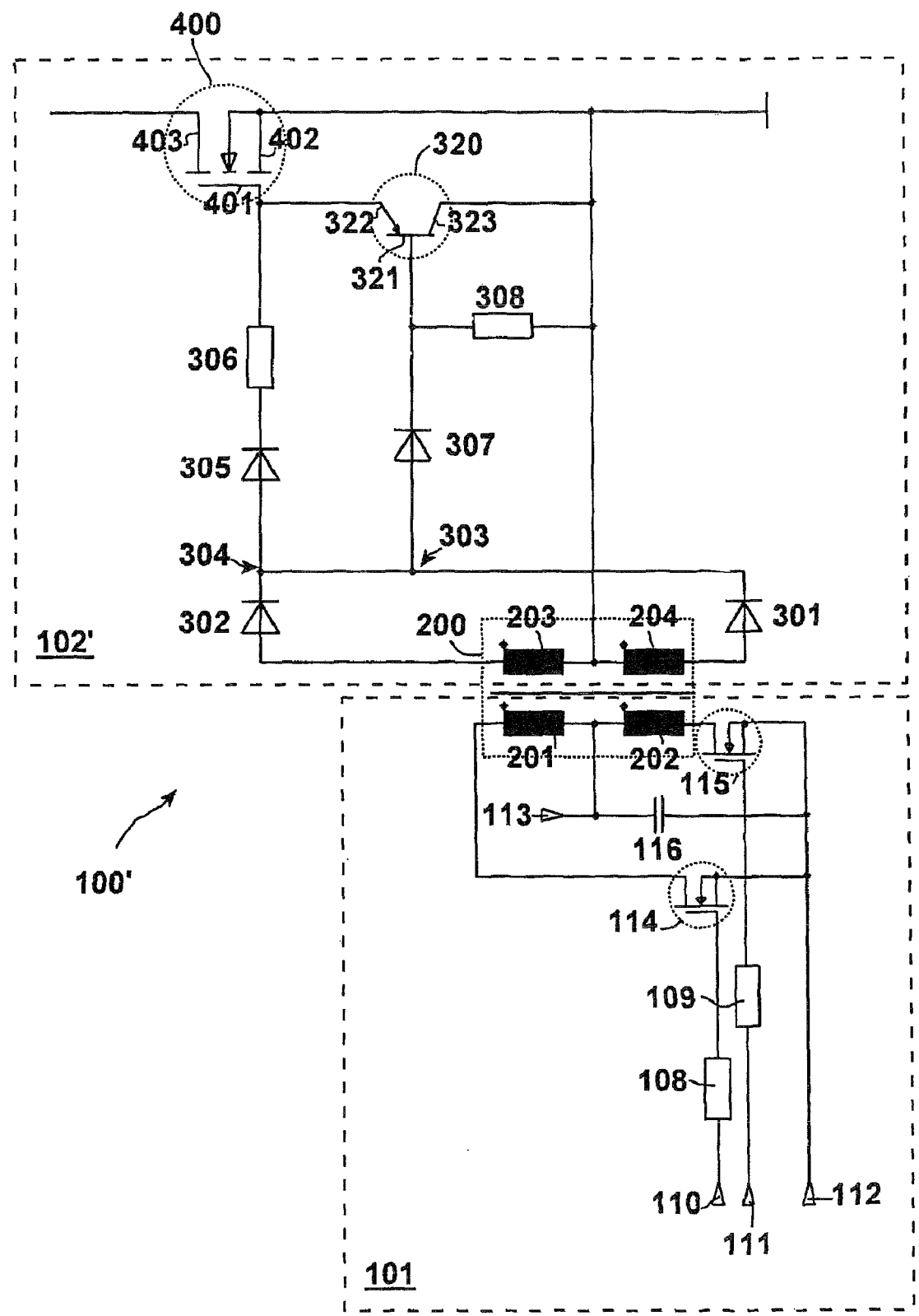
FIG. 1 shows a circuit diagram of a circuit arrangement for galvanically separate triggering of a semiconductor switch in accordance with the prior art.

In conjunction with FIG. 1, a circuit arrangement 100' of the prior art will first be described.

The circuit arrangement 100' can be subdivided into two areas: a control circuit 101 (circuit part at trigger potential), and a driver circuit 102' (circuit part at switch potential). The two circuits are coupled galvanically separately, via a transformer 200, to two primary coils 201, 202 and two secondary coils 203, 204.

In the control circuit 101, the trigger signals are furnished via terminals 110 and 111. One terminal 112 is connected to ground. One terminal 113 is connected to a positive supply voltage, in this example 15 V. There is a complementary trigger signal, for instance at a switching frequency of 250 kHz and a predetermined activation delay of 30 ns, for instance, at the inputs 110, 111. This signal can be drawn for instance from a logic circuit or furnished by a conventional computer that has a suitable control card. The signal is in the low-voltage range, for instance approximately 2.5 V. By means of the trigger signal, transistors 114, 115 are put in alternation into a conducting state. Thus the supply voltage applied to the input 113 is connected to ground 112 in alternation via the primary coils 201 and 202. For supporting the supply voltage, a capacitor 116 is also connected between the supply voltage and ground 112.

On the driver circuit end 102', a predetermined voltage is induced in the secondary coils 203 and 204. Via diodes 301, 302, a positive voltage is furnished at node points 303 and 304. A capacitor may be provided for smoothing this voltage. The amplitude of this voltage is determined by the stepup ratio of the transformer 200. It is arranged such that the gate control voltage of a semiconductor switch 400 to be triggered, which is embodied as an n-channel MOSFET, is reached, this voltage preferably being 15 V.

The positive voltage at the node point 304 is applied via a diode 305 and a resistor 306 to the gate 401 of the MOSFET 400. As a result, the MOSFET 400 becomes conducting between its source electrode 402 and drain electrode 403. Via the node point 303 and a further diode 307, the positive control voltage is also applied to a base 321 of a control transistor, in this example a pnp transistor 320. In that case, there is no voltage between the gate electrode 401 of the MOSFET 400 and the base electrode 321 of the pnp transistor 320.

An emitter electrode 322 of the pnp transistor 320 is connected to the gate electrode 401 of the MOSFET 400. A collector electrode 323 of the pnp transistor 320 is connected to the source electrode 402 of the MOSFET 400. In addition, the collector electrode 323 of the pnp transistor 320 and the source electrode 402 of the MOSFET 400 are connected to ground. The base electrode 321 of the pnp transistor 320 is likewise connected to ground, via a resistor 308.

In order to put the MOSFET 400 back into the nonconducting state, the trigger signal is disconnected in the control circuit 101. As a result, no further voltage is induced in the secondary coils 203, 204 in the driver circuit 102'. The positive voltage applied to the base electrode 321 of the pnp transistor 320 now drops to ground potential via the resistor 308. The positive voltage present at the gate electrode 401 of the MOSFET 400 is disconnected from ground via the diodes 305, 302. Thus a negative voltage builds up between the base electrode 321 of the pnp transistor 320 and the gate electrode 401 of the MOSFET 400. If this negative voltage reaches a predetermined value, which is the threshold value of the pnp transistor 320, then the pnp transistor 320 becomes conducting between its emitter electrode 322 and its collector electrode 323. Thus the gate electrode 401 of the MOSFET 400 is likewise connected to ground potential and as a result discharges. If the positive voltage present at the gate electrode 401 now drops below the threshold voltage value of the MOSFET, the latter becomes nonconducting.

The gate 401 of the MOSFET 400 can discharge, via the connected pnp transistor 320, only down to a residual potential at the level of the base-to-emitter voltage of the transistor, which in a Darlington transistor is for instance 1.4 V, and the voltage that drops at the resistor 308. Residual gate voltages of approximately 2.5 V are then attained. Since via the Miller capacitance of the MOSFET, at the moment of deactivation, additional voltage peaks are created by charge reversal events, the problem arises that the semiconductor switch is unintentionally reset into the conducting state (double- or multiple-switching) once the gate voltage reaches the minimal activation voltage, for instance of approximately 5 V.

Figure 2:
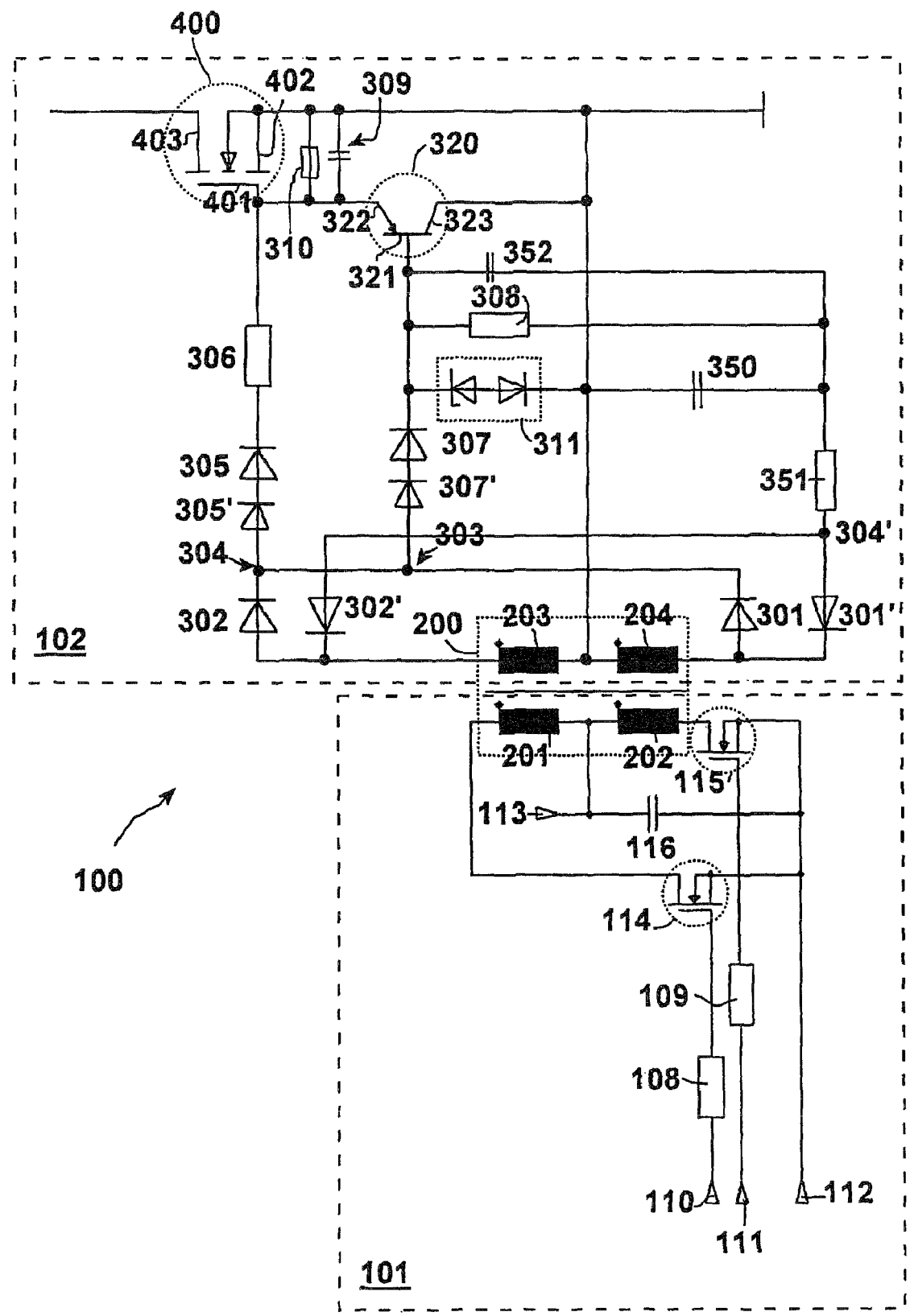
FIG. 2 shows a circuit diagram of a circuit arrangement of the invention for galvanically separate triggering of a semiconductor switch.

To ameliorate these problems, the version according to the invention is therefore proposed. This will be described below in conjunction with FIG. 2.

First, the distinctions of the circuit arrangement from the prior art (FIG. 1) will be described. The control circuit 101 of both circuit arrangements 100 and 100' is constructed identically.

The driver circuit (circuit part at switch potential) 102 of the circuit arrangement 100, conversely, is distinguished from the driver circuit 102' of the circuit arrangement 100' (prior art).

Besides the diodes 301, 302 described for furnishing a positive voltage at the points 303, 304, diodes 301', 302' are now provided as well, in order to furnish a negative voltage at a node point 304'. The negative voltage is carried via a resistor 351 (for instance 100 R) to a first terminal of a capacitor 350 (for instance 10 nF), whose second terminal is at ground potential. The capacitor 350 therefore becomes negatively charged.

It can also be seen that the diodes 305 and 307 are embodied redundantly, with two diodes 305' and 307' connected in series with them. The function of these additional diodes will be described hereinafter.

For switching on the MOSFET 400, the transformer 200 is triggered on the primary side with a push-pull signal, for instance at a frequency of 250 khz. This is done via the two transistors, such as FETs, 114, 115, which are triggered for instance via logic gates (not shown). The square voltage thus generated on the secondary side is rectified and is available as direct voltage at the gate 401 of the MOSFET 400. The stepup ratio of the transformer 200 is selected such that at the gate 401, taking diode flux voltages and the conducting-state power losses of the triggering transistors 114, 115, the resultant voltage is approximately +15 V.

The charge current of the gate capacitor of the MOSFET 400 and of a parallel capacitor 309 (such as 10 nF) is limited by a resistor 306 (such as 10 R) and the $RDS_{on}$ of the FETs 114, 115. The activation speed of the MOSFET can be adjusted via the level of the charge current. The capacitor 309 provided parallel to the gate-to-source path of the MOSFET 400 has the task of buffering the interference currents fed in during the "on" phase via the Miller capacitance of the MOSFET, and thus of keeping the gate voltage of the MOSFET "clean" of interference spikes.

A resistor (such as 4K99) connected parallel to the capacitor 309 also, when the maximum gate voltage is reached, assures a current through the charge diodes 305, 305' and thus assures a defined flux voltage.

In the embodiment shown, the gate voltage is additionally limited at the base 321 of the pnp transistor 320 to permissible values (such as below 20 V) via a diode array 311, which is embodied as a Zener diode with protection against polarity reversal. This is diode array is optional and can also be omitted.

For switching the MOSFET 400 off, the triggering via the transformer 200 is terminated. During the "on" phase, the pnp transistor 320 is closed, since along its $U_{BE}$ path, no voltage is created. Once the triggering of the transformer 200 has ended, positive potential applied to the base 321 of the pnp transistor 320 drops, via the resistor 308 (2 k), in the direction of the value of the negative auxiliary voltage. The positive voltage applied to the gate electrode 401 of the MOSFET 400 is decoupled via the diodes 305, 305'. Thus a negative voltage $U_{BE}$ builds up between the base electrode 321 of the pnp transistor 320 and the gate electrode 401 of the MOSFET 400. If this negative voltage reaches a predetermined value, which is the threshold value of the pnp transistor 320, then the pnp transistor 320 becomes conducting between its emitter electrode 322 and its collector electrode 323. The gate electrode 401 of the MOSFET 400 is thus likewise connected to ground potential and therefore discharges.

The switching-off speed of the MOSFET can be adjusted via the time constant of the base resistor 308 and a parallel capacitor 352 (for instance 330 pF), taking the basic current component into account.

Via the two diodes 301' and 302', the resistor 351 for current limitation, and the capacitor 350, a negative auxiliary voltage is generated. This is necessary in order to compensate for the principle disadvantage of this driver stage concept, namely the unipolar gate triggering. As explained in conjunction with FIG. 1 (prior art), the gate 401 of the MOSFET 400 could be discharged only to the sum of $U_{BE}$ of the pnp transistor 320 and the voltage drop at its base resistor 308, if the base resistor 308 of the pnp transistor 320 were not connected to the negative auxiliary voltage but instead were connected to the emitter potential of the MOSFET 400. The consequence of this would be that the current flow created upon the charge reversal of the Miller capacitance of the MOSFET, the gate capacitor would charge to at least 2.5 V. However, in order to have a large enough voltage interval from the minimum threshold voltage of the MOSFET (typically a minimum of 5 V), it is absolutely necessary to keep the gate voltage below 2.5 V under all circumstances. Because of the relationship of the base resistor 308 to the negative auxiliary voltage, the gate 401 of the MOSFET 400 can be discharged down to 0 V, since the base potential of the pnp transistor 320, in the OFF state, is at −2.1 V. Despite the more-negative auxiliary voltage, however, no more than −2.1 V can occur at the base 321 of the pnp transistor 320, since the base 321 is clamped to the source potential (such as ground) of the MOSFET 400 via the three diodes 302, 307, 307' and the winding 203, or the three diodes 301, 307, 307' and the winding 204, of the switched-off transformer 200.

In generating the push-pull trigger signal on the primary side for the transformer 200, it should preferably be taken into consideration that upon a synchronous onset of the clock signal and trigger signal, the FETs 114, 115 are each triggered in alternation, in order to prevent saturation of the transformer from unilateral magnetization. This proves to be advantageous since the great majority of the triggering energy is already transmitted in the first pulse.

It is understood that the preferred embodiments, described above, of the method of the invention are merely examples. Besides these, further solutions are conceivable for one skilled in the art without departing from the scope of the present invention.

The invention claimed is:

1. A circuit arrangement (100) for galvanically separate triggering of a semiconductor switch (400),
    in which the circuit arrangement has a control circuit (101), that is, a circuit part at trigger potential, a driver circuit (102), that is, a circuit part at switch potential, a transformer (200) for galvanically separate transmission of a trigger signal from the control circuit (101) as a switch signal to the driver circuit (102), and means (301, 302) for rectification of the switch signal,
    and the semiconductor switch (400) is embodied with a gate electrode (401), a source electrode (402), and a drain electrode (403) in the driver circuit (102) and is switchable by a predetermined first voltage between the gate electrode (401) and the source electrode (402), so that a predetermined current flows between the drain electrode (403) and the source electrode (402),
    and the switch signal is capable of being applied to the gate electrode (401) in order to switch the semiconductor switch (400), and the driver circuit (102) includes a control transistor (320) with a base electrode (322), an emitter electrode (322), and a collector electrode (323), and the control transistor (320) is switchable by a predetermined second voltage between the base electrode (321) and the emitter electrode (322), so that, via the emitter electrode (322) and the collector electrode (323), the gate electrode (401) of the semiconductor switch (400) is capable of being connected to the source electrode (402) of the semiconductor switch (400), in order to switch over the semiconductor switch, characterized by voltage generating means (350) for generating a third voltage, rectified relative to the second voltage, between the base electrode (321) and the collector electrode (323) of the control transistor (320).

2. The circuit arrangement (100) as defined by claim 1, characterized in that the base electrode (321) of the control transistor (320) is connected to one pole of the voltage generating means (350) and, via at least one and preferably two or three diodes (301, 307, 307'; 302, 307, 307'), in particular via parts (203, 204) of the transformer (200), to the source electrode (402) of the semiconductor switch (400).

3. The circuit arrangement (100) as defined by claim 1, characterized in that the voltage generating means (350) are embodied as at least one capacitive component, in particular as a capacitor (350).

4. The circuit arrangement (100) as defined by claim 1, characterized by a diode array (311), which has at least one Zener diode with protection against polarity reversal, between the base electrode (321) and the collector electrode (322) of the control transistor (320), for limiting the voltage between the gate electrode (401) and the source electrode (402) of the semiconductor switch (400).

5. The circuit arrangement (100) as defined by claim 1, characterized by a capacitive component (309), in particular a capacitor, between the gate electrode (401) and the source electrode (402) of the semiconductor switch (400), for buffering interference currents fed in via a Miller capacitance of the semiconductor switch (400).

6. The circuit arrangement (100) as defined by claim 1, characterized in that the semiconductor switch (400) is embodied as a unipolar transistor, in particular as a FET, MOSFET, or IGBT.

7. The circuit arrangement (100) as defined by claim 6, characterized in that the semiconductor switch (400) is embodied as a unipolar n-channel transistor and the control transistor (320) is embodied as a bipolar pnp transistor and the gate electrode (401) of the semiconductor switch (400) is connected to the emitter electrode of the control transistor (320), and the source electrode (402) of the semiconductor switch (400) is connected to the collector electrode (323) of the control transistor (320), and the voltage generating means (350) are embodied for generating a negative voltage between the base electrode (321) and the collector electrode (323) of the control transistor (320).

8. The circuit arrangement (100) as defined by claim 7, characterized in that the base electrode (321) of the control transistor (320) is connected to the negative pole of the voltage generating means (350) and, via at least two and preferably three diodes (301, 307, 307'; 302, 307, 307') to the source electrode (402) of the semiconductor switch (400).

9. A method for galvanically separate triggering of a semiconductor switch (400), in which a circuit arrangement (100), having a control circuit (101), a driver circuit (102), and a transformer (200) for galvanically separate transmission of a trigger signal from the control circuit (101) as a switch signal into the driver circuit (102), and means (301, 302) for rectifying the switch signal are used, and the semiconductor switch (400) is embodied with a gate electrode (401), a source electrode (402), and a drain electrode (403) in the driver circuit (102) and is switchable by a predetermined first voltage between the gate electrode (401) and the source electrode (402), so that a predetermined current flows between the drain electrode (403) and the source electrode (402), and the switch signal is capable of being applied to the gate electrode (401) in order to switch the semiconductor switch (400), and the driver circuit (102) includes a control transistor (320) with a base electrode (322), an emitter electrode (322), and a collector electrode (323), and the control transistor (320) is switchable by a predetermined second voltage between the base electrode (321) and the emitter electrode (322), so that, via the emitter electrode (322) and the collector electrode (323), the gate electrode (401) of the semiconductor switch (400) is capable of being connected to the source electrode (402) of the semiconductor switch (400), in order to switch over the semiconductor switch, characterized in that a third voltage, rectified relative to the second voltage, is generated between the base electrode (321) and the collector electrode (323) of the control transistor (320).

10. The method as defined by claim 9, that the semiconductor switch (400) is embodied as a unipolar n-channel transistor and the control transistor (320) is embodied as a bipolar pnp transistor and the gate electrode (401) of the semiconductor switch (400) is connected to the emitter electrode of the control transistor (320), and the source electrode (402) of the semiconductor switch (400) is connected to the collector electrode (323) of the control transistor (320), and a negative voltage is generated between the base electrode (321) and the collector electrode (323) of the control transistor (320).

11. The method as defined by claim 10, characterized in that the base electrode (321) of the control transistor (320) is connected to the negative pole of the voltage generating means (350) and, via at least two and preferably three diodes (301, 307, 307'; 302, 307, 307'), in particular via parts (203, 204) of the transformer (200), to the source electrode (402) of the semiconductor switch (400).

* * * * *